United States Patent
Ohshita

(10) Patent No.: US 7,285,906 B2
(45) Date of Patent: Oct. 23, 2007

(54) FILM FORMATION MASK, ORGANIC EL PANEL, AND METHOD OF MANUFACTURING THE ORGANIC EL PANEL

(75) Inventor: Isamu Ohshita, Yamagata-ken (JP)

(73) Assignee: Tohoku Pioneer Corporation, Tendo-Shi, Yamagata-Ken (JP)

( * ) Notice: Subject to any disclaimer, the term of this patent is extended or adjusted under 35 U.S.C. 154(b) by 392 days.

(21) Appl. No.: 10/793,228

(22) Filed: Mar. 5, 2004

(65) Prior Publication Data

US 2004/0183435 A1    Sep. 23, 2004

(30) Foreign Application Priority Data

Mar. 19, 2003    (JP) .............................. 2003-074888

(51) Int. Cl.
*H01J 1/62*    (2006.01)
(52) U.S. Cl. ..................................... 313/504; 313/506
(58) Field of Classification Search ................ 313/504, 313/506; 445/25; 527/66, 69
See application file for complete search history.

(56) References Cited

U.S. PATENT DOCUMENTS 6,784,459 B2 *    8/2004    Seki et al. .................... 257/88

2004/0104197 A1 *    6/2004    Shigemura et al. ........... 216/20
2005/0264177 A1 *    12/2005    Chung et al. ................ 313/503

FOREIGN PATENT DOCUMENTS

| JP | 2000-48954 | 2/2000 |
|---|---|---|
| JP | 2001-237068 | 8/2001 |
| JP | 2002-367787 | 12/2002 |

\* cited by examiner

*Primary Examiner*—Vip Patell
(74) *Attorney, Agent, or Firm*—McGinn IP Law Group, PLLC

(57) ABSTRACT

In forming luminescent areas of organic EL devices of an organic EL display panel, it is necessary to prevent a display performance degradation in the vicinity of outermost edges of display area of the organic EL display panel. A film formation mask is used to form a film pattern of an organic layer containing a luminescent layer, in a manner such that the luminescent area formation sections can be covered. The film formation mask has a plurality of openings according to the film pattern, and false openings formed outside the area containing the openings but not useful in forming organic layer for forming luminescent areas. False openings are formed in positions corresponding to the outside of display area, and forms false patterns of an organic layer on the inner side of the adhesive area.

8 Claims, 10 Drawing Sheets

ENLARGED VIEW OF PORTION A

FILM FORMATION MASK, ORGANIC EL PANEL, AND METHOD OF MANUFACTURING THE ORGANIC EL PANEL

BACKGROUND OF THE INVENTION

The present invention relates to a film formation mask, an organic EL (Electroluminescent) panel formed by the film formation mask, and a method of manufacturing the organic EL panel.

The present application claims priority from Japanese Application No. 2003-74888, the disclosure of which is incorporated herein by reference.

An organic EL panel is produced by forming surface light emitting elements (based on luminescent areas of organic EL devices) on a substrate, and forming a display area by arranging one or more surface light emitting elements. The luminescent areas are formed by providing lower electrodes of various structures on the substrate, and then forming thereon a film pattern of an organic layer containing an organic luminescent layer, followed by forming thereon upper electrodes. Here, the film pattern is formed by using a film formation mask having openings corresponding to the film pattern, and accomplished by vapor deposition using the mask.

A process of forming an organic layer film pattern using the film formation mask can be described as follows. Namely, luminescent areas of organic EL devices are usually partitioned by an insulating film formed on the substrate. Then, the film formation mask having openings of slightly larger width than luminescent areas is used to form an organic layer film pattern on the luminescent areas. In particular, when a plurality of colors are to be displayed, it is required to use a film formation mask having openings corresponding to a desired pattern of different luminescent colors. Thus, by changing or sliding the mask at an appropriate timing, it is possible to paint different colors on the organic luminescent layer (Japanese Unexamined Patent Application Publication No. 2002-367787).

Here, the organic layer includes an organic luminescent layer and other layers (an electroluminescent layer, a hole transporting layer, an electron transporting layer, a hole injection layer, and an electron injection layer). Although an organic layer is usually in a multi-layer structure, it is also allowed to contain only single one layer which is an organic luminescent layer. Generally, even with a hole transporting layer and an electron transporting layer or the like (each formed of a single one kind of material and mounted on an identical substrate), it is allowed to use a film formation mask having different patterns corresponding to different luminescent colors in order to control film thickness in each area of each luminescent color (Japanese Unexamined Patent Application Publication No. 2001-237068).

To display a plurality of colors, there has been known not only the aforementioned method of painting different luminescent colors, but also CF Method and CCM Method in which an organic layer of a single color such as white or blue is formed and a color conversion layer based on a color filter or a fluorescent material is incorporated. Further, there is Photobleaching Method in which an electromagnetic wave is applied to a specific area on an organic layer of a single color so as to realize a multi-color emission. At this time, although it is not necessary to paint different colors to cover each color, it is required to use a film formation mask having a desired pattern in order to form an organic layer of a specific pattern in a display area.

However, even when only single one color is displayed, it was still required to use a film formation mask which has a predetermined pattern (usually, stripe-shaped pattern) corresponding to luminescent areas. At this time, in order to avoid a mask strength deterioration due to a dense distribution of openings, an opening pitch (an interval between every two adjacent openings) is enlarged, thereby forming an organic layer film pattern in the display area of a display panel by dividing a film formation process into several steps (Japanese Unexamined Patent Application Publication No. 2000-48954).

In using a film formation mask for forming luminescent areas of organic EL devices on a substrate (i.e., when the mask is placed on the substrate), a tension is usually added to the perimeter of the mask to avoid the slacking of the mask, thereby keeping the entire mask in a completely flat state. However, with the addition of the tension to the perimeter of the mask, distortion will occur in the outermost openings of the film formation mask irrespective of the shape of these openings. Then, once film pattern is formed on the substrate through the deformed openings, film pattern disorder will occur near the outmost edges of the display area, resulting in deteriorated display performance near the outermost edges of the display area. Consequently, it becomes impossible to ensure an appropriate display in the entire display area.

Moreover, it is known that an organic layer of each organic EL device will be deteriorated due to an unavoidable contact with the surrounding atmospheric air, since moisture and oxygen existing in the surrounding atmospheric air can cause such deterioration. In order to prevent such deterioration, an entire display area of an organic EL panel is usually covered by an encapsulation member. In detail, an adhesive agent is applied to the substrate outside the display area so as to form an adhesive-applied perimeter around the display area. Then, an annular area along the perimeter of the encapsulation member is tightly bonded to the adhesive-applied area of the substrate, thereby protecting the entire display area of organic EL panel from the surrounding atmospheric air.

However, since an adhesive agent for use in the capsulation also contains moisture, oxygen or the like which can deteriorate the organic layer, when such an adhesive agent get into contact with the organic layer, the moisture and oxygen or the like will invade into the organic layer and thus cause the organic layer to be deteriorated. In particular, if an amount of the adhesive agent applied is too large, the applied adhesive agent will spread towards the display area once the encapsulation member is pressed onto the substrate, hence causing the adhesive agent to contact the outer edge of the display area. As a result, the display performance will be deteriorated near the outermost edge of the display area, making it impossible to ensure an appropriate display in the entire display area.

SUMMARY OF THE INVENTION

The present invention is to solve the above-discussed problems and an object of the invention is that when luminescent areas of organic EL devices are formed by using a film formation mask so as to form organic layer film pattern on a substrate, it is possible to prevent display performance deterioration near the outermost edges of the display area of an obtained display panel.

In one aspect of the present invention, there is provided a film formation mask for forming an organic layer film pattern when organic EL devices are to be formed on a substrate, each organic EL device including a pair of electrodes and an organic layer containing an organic luminescent layer, the organic layer being interposed between the pair of electrodes, characterized in that the film formation mask has openings arranged corresponding to a film pattern for forming luminescent areas of the organic EL devices, and has false openings not for use in forming the organic layer and located outside an area containing the openings.

In another aspect of the present invention, there is provided an organic EL panel including a substrate and organic EL devices formed on the substrate, each organic EL device including a pair of electrodes and an organic layer containing an organic luminescent layer, the organic layer being interposed between the pair of electrodes, characterized in that formed on the substrate are a film pattern of the organic layer for forming luminescent areas of the organic EL devices, and false patterns of the organic layer located outside an area containing the luminescent areas.

In a further aspect of the present invention, there is provided a method of manufacturing an organic EL panel including a substrate and organic EL devices formed on the substrate, each organic EL device including a pair of electrodes and an organic layer containing an organic luminescent layer, the organic layer being interposed between the pair of electrodes, characterized in that in a process of forming on the substrate a film pattern of the organic layer for forming luminescent areas of the organic EL devices, false patterns of the organic layer are also formed on the substrate outside an area containing the luminescent areas.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
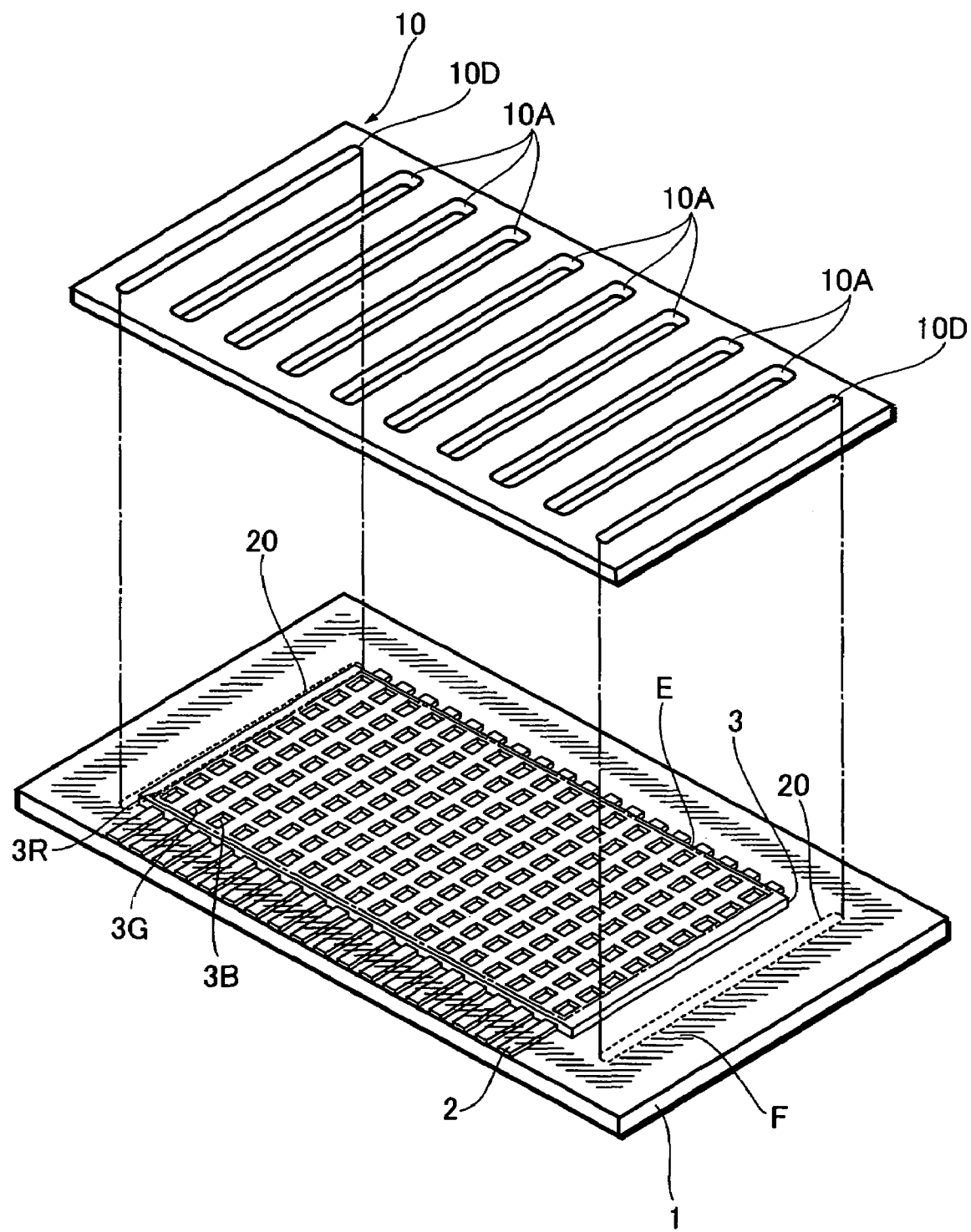
FIG. 1 is an explanatory view showing a film formation mask according to an embodiment of the present invention.

Several preferred embodiments of the present invention will be described in detail below with reference to the accompanying drawings. FIGS. 1 to 4 are explanatory views showing a film formation mask according to one embodiment of the present invention. A film formation mask 10 shown in the drawings is used to form an organic layer having a predetermined pattern, so that it is possible to form on substrate organic EL devices each including a pair of electrodes and an organic layer containing an organic luminescent layer and interposed between the pair of electrodes. Here, so-called organic layer means a single or several organic luminescent layers. Alternatively, it means an organic luminescent layer and one or all of organic layers provided in the vicinity of the organic luminescent layer.

As shown in FIG. 1, a plurality of lower electrodes 2 consisting of ITO or the like are formed in accordance with a predetermined electrode structure (for example, stripe-shaped electrodes) on a substrate 1 consisting of a transparent glass, and a plurality of luminescent area formation sections 3R, 3G, and 3B are formed and partitioned by virtue of an insulating film 3 over the lower electrodes. Then, a film formation mask 10 is used to form a film pattern of an organic layer which contains a luminescent layer, in a manner such that these luminescent area formation sections 3R, 3G, and 3B are covered up. In an embodiment shown in the accompanying drawings, red luminescent area formation sections 3R, green luminescent area formation sections 3G, and blue luminescent area formation sections 3B are formed on each row. In fact, the film formation mask 10 is used to form a film pattern for forming luminescent areas corresponding to the luminescent area formation sections of one of the three colors, and has a plurality of openings 10A according to the film pattern.

The film formation mask 10 used in the present embodiment has two false openings 10D, with one on each side of the mask and located outside the area containing the openings 10A, which are not used in forming an organic layer for forming luminescent areas. Such false openings 10D will be located on the substrate 1 outside the display area E of display panel, thereby forming organic layer false patterns 20 inside an adhesive applying area F. Here, so-called false patterns 20 are film patterns not involving luminescent areas, although they are patterns formed by the same material as the organic layer forming luminescent areas.

Figure 2:
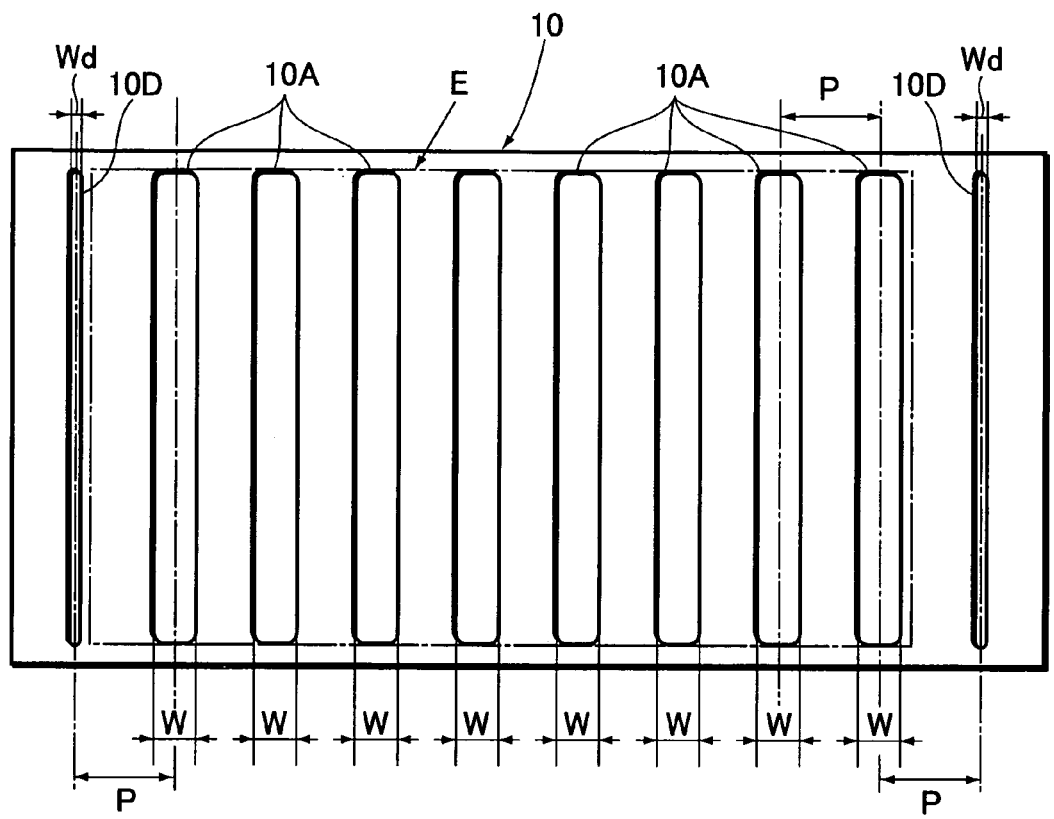
FIG. 2 is a plan view showing the film formation mask of the present invention.

FIG. 2 is a plan view showing the film formation mask 10. As described above, the film formation mask 10 has the openings 10A and the false openings 10D. When the film formation mask 10 is disposed on a substrate for forming organic EL devices, the openings 10A of the film formation mask 10 are located inside the display area E of display panel, while the false openings 10D are placed outside the display area E. Although an example shown in FIG. 2 illustrates that the false openings 10D are provided on both sides (left and right) of the area containing the openings 10A, it is also possible for only one side (left or right) of the area (containing the openings 10A) to have such a false opening.

Actually, the film formation mask 10 of the present embodiment is such that its stripe-like openings 10A are formed in accordance with a predetermined pitch P. Where the openings 10A are used for painting two or more different luminescent colors on organic luminescent layer, the pitch P is set at $P=nP_E$ (n: number of different colors; $P_E$: luminescent area pitch). Further, the width W of each opening 10A is set to be larger than the width of each luminescent area formation section (3R, 3G, 3B) mentioned above. Moreover, in the film formation process using vapor deposition, there will be some film formation errors due to some error factors (such as pattern deformation due to spread of vapor deposition flow, an operation deviation with the film formation mask, an error of precision in forming mask openings). Accordingly, by making the width W to be larger than the width of each luminescent area formation section, it is possible for film pattern not to deviate from the luminescent area formation sections even if it is expected that there will be a maximum error in film formation.

The film formation mask 10 in the present embodiment has two false openings 10D separated by pitch P from the outermost openings 10A of the mask 10. The width Wd of each false opening 10D is narrower than the width W of each opening 10A. In this way, when the film formation mask 10 is slid by a distance P/n each time to form a false pattern 20 by virtue of a false opening 10D, the formed false pattern 20 will not be overlapped by film pattern. In determining the width Wd, it is necessary to take into account some film formation errors based on some error factors (such as pattern deformation due to spread of vapor deposition flow, an operation deviation with the film formation mask, an error of precision in forming mask openings) Namely, if the above film formation errors are taken into account while at the same time making the Wd of each false opening 10D to be narrower than the width W of each opening 10A, it is possible to form the false patterns 20 without any overlapping.

Figure 3:
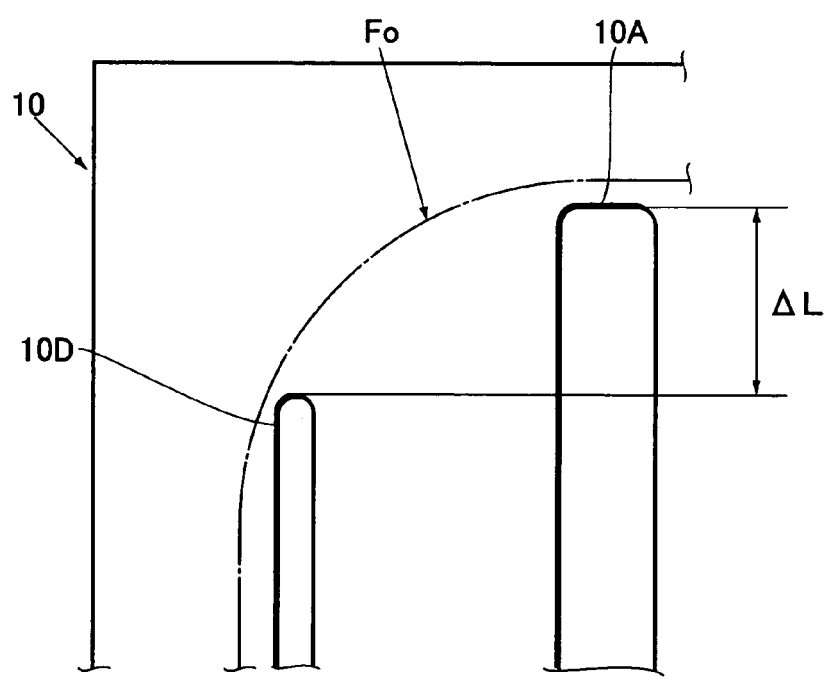
FIG. 3 is an explanatory view showing the film formation mask of the present invention, indicating the size of false openings.

FIG. 3 shows the dimension of the false openings 10D of the film formation mask 10. As shown, the false openings 10D are to be located on the substrate 1 outside the display area E to form the false patterns 20 of an organic layer inside the adhesive applying area F, so that it is necessary to take into account a relationship between the length of the false openings 10D and the inner edge $F_o$ of the adhesive applying area F. In the present embodiment, the length of each false opening 10D is shorter than the length of each opening 10A by ΔL, corresponding to each corner portion of the substrate 1. In this way, it is possible to ensure sufficient adhesive applying area F, and to avoid an overlap between the adhesive applying area F and the false patterns 20 formed by virtue of the false openings 10D.

Figure 4:
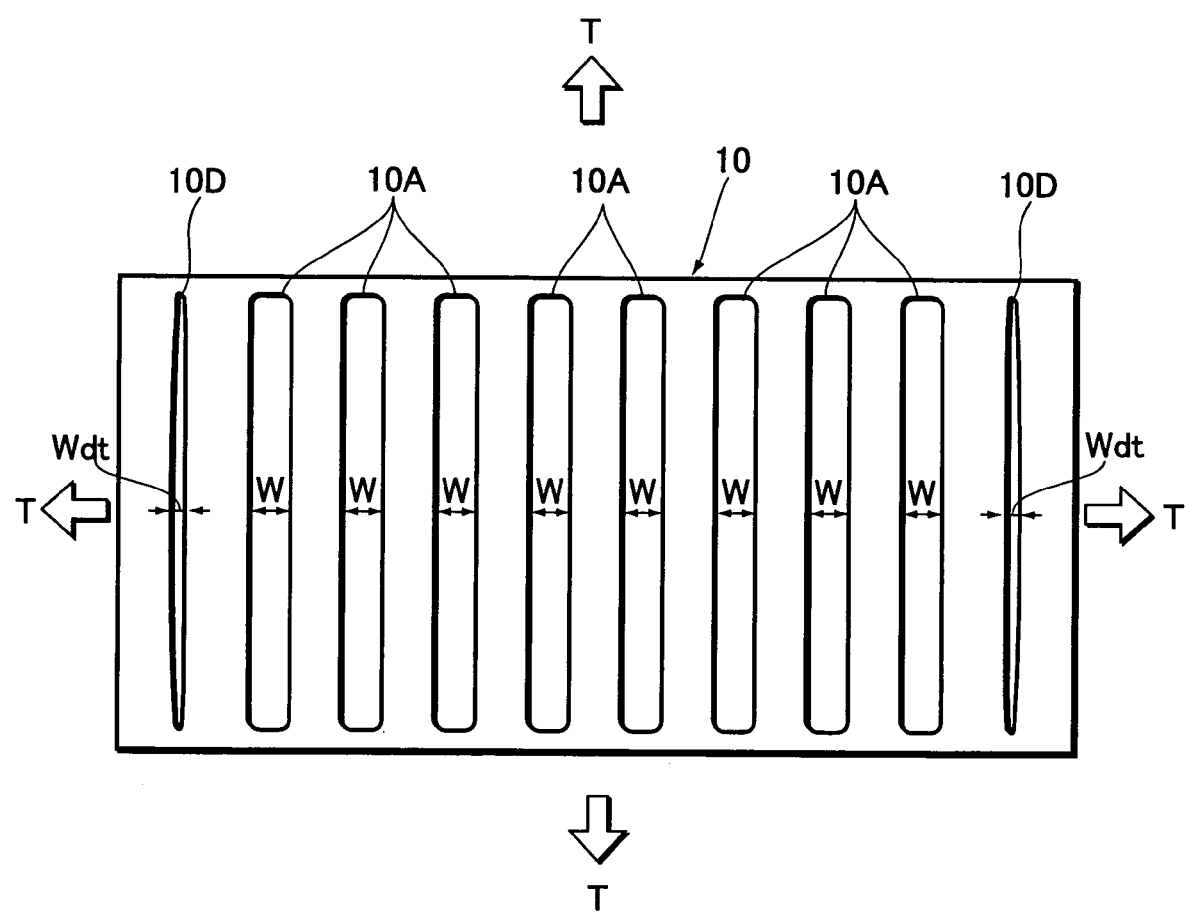
FIG. 4 is an explanatory view showing an operation of the film formation mask of the present invention.

FIG. 4 is an explanatory view showing the function of the film formation mask 10 of the present embodiment. In practice, the film formation mask 10 is disposed on the substrate 1 for forming a film pattern which later forms luminescent areas on the substrate 1. At this time, a tension T is applied to the edge portions of the mask so that the film formation mask 10 will not become slack. Further, in the film formation mask 10 of the present embodiment, the false openings 10D formed beyond the outmost openings 10A can absorb a deformation caused by the tension T, so that the width of each false opening 10D becomes larger (Wd<Wdt). In this way, even if there is such tension T, there would be no change in the width W of each opening 10A which forms the film pattern on luminescent areas. Therefore, it is possible for an organic EL panel (formed by the film formation mask 10) to obtain a good display performance throughout the entire display area, without any disorder in film pattern near the outermost edges of the display area.

Figure 5:
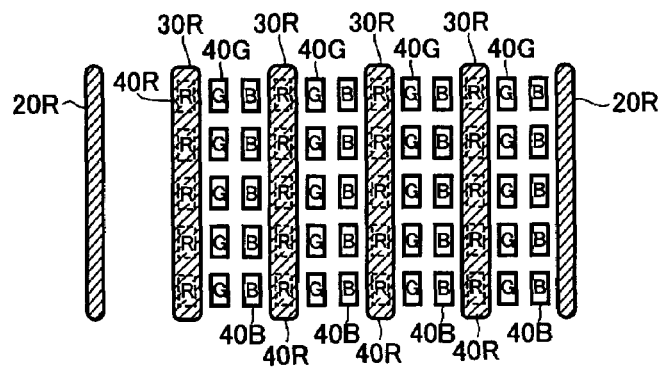
FIGS. 5A-5D are explanatory views showing a process of manufacturing an organic EL panel using the film formation mask of the present invention.
Figure 5:
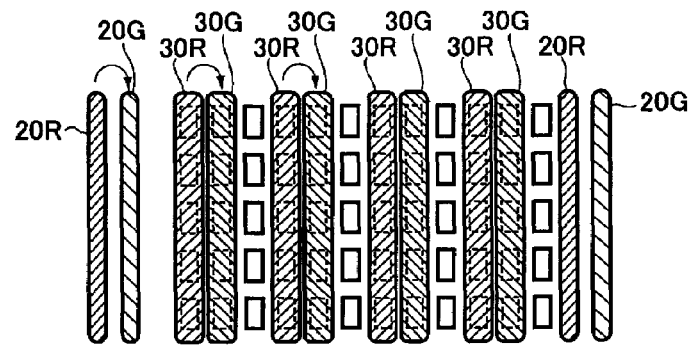
Figure 5:
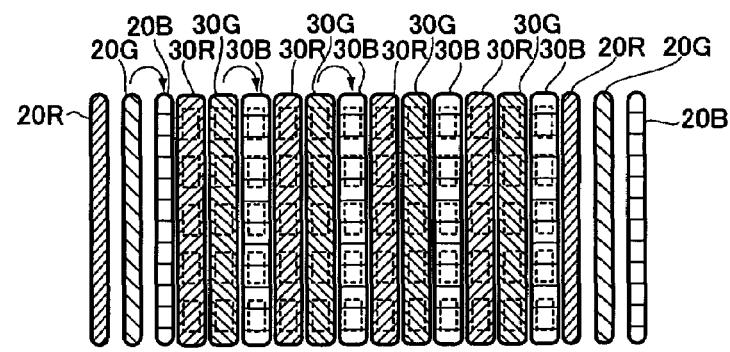
Figure 5:
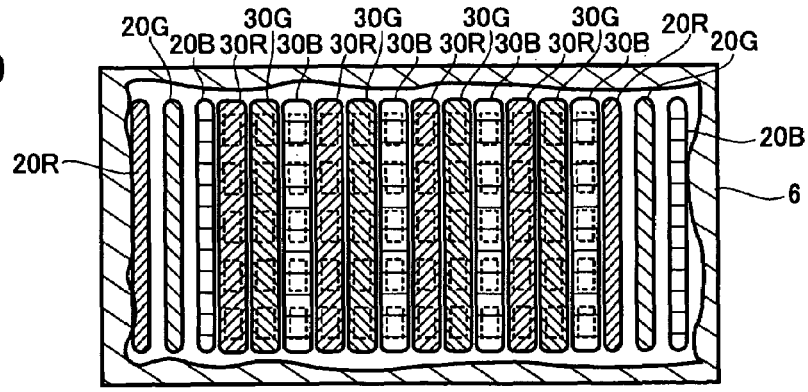

FIG. 5 provides several explanatory views showing a method of manufacturing an organic EL panel using the film formation mask 10. In fact, an organic EL panel is formed by arranging a plurality of (or singular number of) luminescent areas of organic EL devices as surface light emitting areas on a substrate. Although the following description is focused on using the film formation mask 10 to paint an organic luminescent layer with different colors corresponding to respective luminescent colors, the description should not for many limitation to the organic EL panel manufacturing method using the film formation mask 10 of the present invention. In fact, the method of the present invention can also be applied to the case in which a film pattern of an organic layer other than an organic luminescent layer is formed corresponding to luminescent areas of various colors (for example, when controlling film thickness corresponding to different luminescent colors). Further, although the following description is focused on film formation by painting three colors (R, G, B), this description should not for many limitation to the method of the present invention. Actually, the method of the present invention can also be applied to the case in which film formation is effected by painting different colors to form luminescent areas of at least two colors, and to the case in which film formation is effected by painting single one color through several operations.

FIG. 5A shows a process of forming film stripes 30R of a first color (red). Here, as shown in FIG. 1, the lower electrodes 2 and the insulating film 3 are patterned on the substrate 1 by means of photolithography method or the like, thereby forming luminescent areas 40R, 40G, and 40B partitioned by the insulating film 3. If necessary, an organic layer (such as a hole-injection layer and a hole transporting layer or the like) is formed to act as a substrate layer for an organic luminescent layer. Then, the openings 10A of the film formation mask 10 are set corresponding to the luminescent areas 40R, and film stripes 30R of the organic luminescent layer of the first color (red) are formed on the luminescent areas 40R. At this time, since the film formation mask 10 is provided with the false openings 10D, false patterns 20R consisting of the same organic luminescent layer are formed on the substrate 1 outside the region containing the luminescent areas.

FIG. 5B and FIG. 5C show processes of forming film stripes 30G of a second color (green) and film stripes 30B of a third color (blue). In each of these processes, the film formation mask 10 is moved by a distance P/3, forming film stripes 30G of organic luminescent layer of the second color on luminescent areas 40G and film stripes 30B of organic luminescent layer of the third color on luminescent areas 40B. Meanwhile, false patterns 20G and 20B consisting of the same organic luminescent material are formed on the substrate 1 outside the region containing the luminescent areas.

Then, after other organic layers are formed thereon (if necessary), upper electrodes are formed in positions. Subsequently, as shown in FIG. 5D, an adhesive agent 6 is applied to the perimeter of the substrate to tightly bond an encapsulating member.

Figure 6:
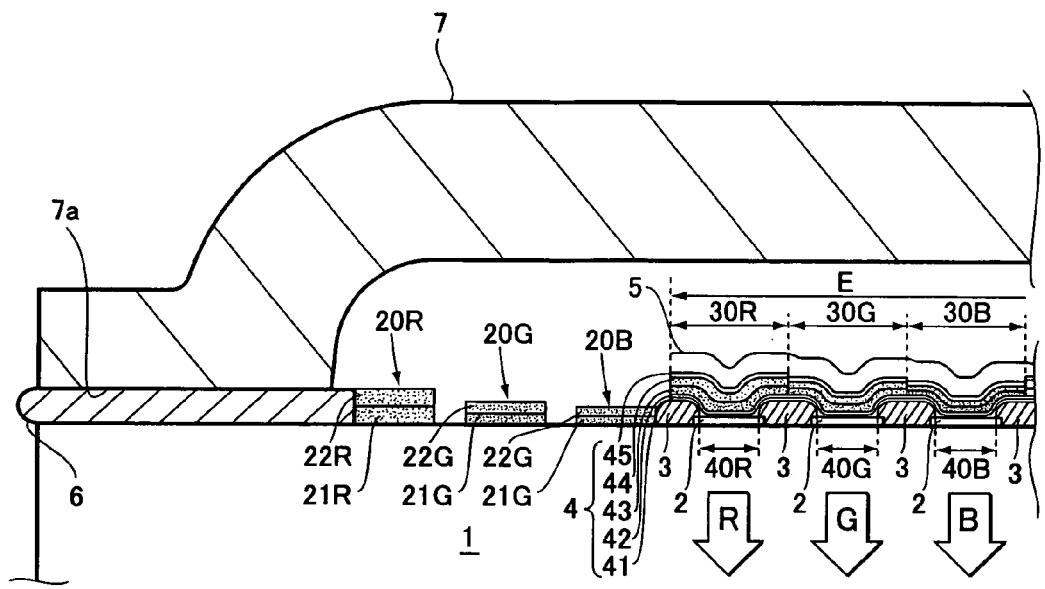
FIG. 6 is a cross sectional view showing an organic EL panel formed according to an embodiment of the present invention, and indicating an area near a base end thereof.

FIG. 6 is an explanatory view (a cross sectional view showing a portion near the base end of the substrate) which illustrates an organic EL panel according to an embodiment of the present invention. As shown, in the organic EL panel of the invention, a plurality of lower electrodes 2 are patterned on the substrate 1, an insulating film 3 is patterned on the lower electrodes 2 in a manner such that luminescent areas 40R, 40G, and 40B (to be formed) are partitioned, an organic layer 4 is laminated on the luminescent areas 40R, 40G and 40B, a plurality of upper electrodes 5 are laminated on the organic layer 4. In this way, each of organic EL devices formed on the substrate corresponding to the respective luminescent areas 40R, 40G and 40B has a structure in which the organic layer 4 is interposed between a pair of electrodes including a lower electrode 2 and an upper electrode 5. Here, the substrate 1 is a transparent substrate, each lower electrode is a transparent electrode such as ITO electrode, thereby making it possible to obtain an organic EL panel (bottom emission type) which allows light to be taken out from the substrate 1 side. However, the present invention should not be limited by this type of EL panel. In fact, it is also possible to form an organic EL panel (top emission type) in which upper electrodes 5 are transparent electrodes and light is taken from a side opposite to the substrate 1.

The organic layer 4 contains a hole injection layer 41 and a hole transporting layer 42 in a manner such that they cover up the entire display area E. Further, the film formation mask 10 is used to form a luminescent layer 43 (serving as an organic luminescent layer) and an electron transporting layer 44. Namely, the film stripes 30R, 30G, and 30B of the luminescent layer 43 and the electron transporting layer 44 are formed having a width corresponding to the width W of the openings 10A of the film formation mask 10. In the embodiment shown in FIG. 6, the film stripes 30R, 30G, and 30B are continuously formed by the setting of the width W of the openings 10A. Alternatively, the width W is set in a manner such that the film stripes are formed with their edge portions overlapped with each other or the film stripes are formed at relatively large interval from one another. In the illustrated embodiment, the electron injection layer 45 is uniformly formed on these film stripes 30R, 30G, and 30B.

Then, the false patterns 20R, 20G, and 20B are formed outside the display area E on the substrate 1. Here, since the film formation mask 10 is used to form the luminescent layer 43 and the electron transporting layer 44, the false patterns 20R, 20G, and 20B are formed by virtue of the patterns 21R, 21G, and 21B obtained during the formation of the luminescent layer 43, as well as the patterns 22R, 22G, and 23B obtained during the formation of the electron transporting layer 44. Further, an adhesive agent 6 is applied outside the outermost false patterns 20R, so that an adhesion surface 7a of a cover 7 is allowed to be pressed thereon, thereby rendering the cover 7 to be tightly bonded to the outer periphery of the substrate 1.

As described above, the organic layer 4 has a five-layer structure including the hole injection layer 41, the hole transporting layer 42, the luminescent layer 43, the electron transporting layer 44, and the electron injection layer 45. On the other hand, it is also possible to form one-layer structure through four-layer structure by omitting (if necessary) some layers other than luminescent layer 43. Moreover, each of the above layers can be produced not only in the form of single layer, but also possible to be in a multi-layer structure. Besides, it is allowable to add other organic layers (a hole barrier layer, an electron barrier layer or the like).

Although the present embodiment shows that the film formation mask 10 is used to paint the luminescent layer 43 and the electron transporting layer 44 with different colors, the film formation mask 10 can also be used to paint other organic layers with different colors. At this time, the false patterns of the organic layer material (to be painted with different colors) are formed outside the display area E.

Figure 7:
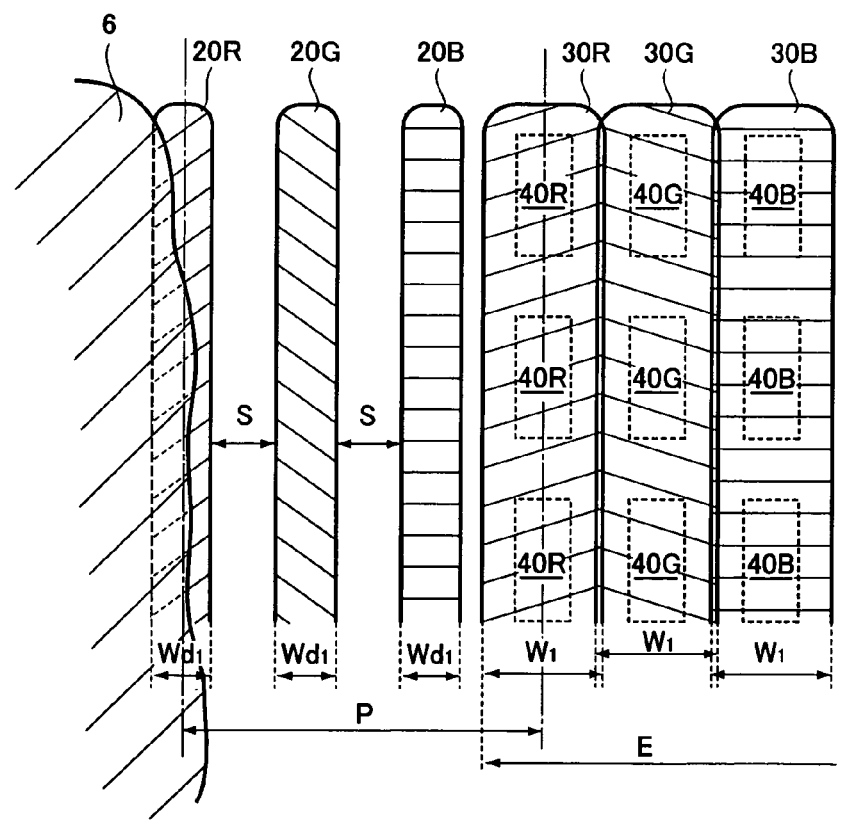
FIG. 7 is an explanatory view showing a method of manufacturing an organic EL panel according to an embodiment of the present invention, and indicating an operation of the manufactured organic EL panel.

FIG. 7 is an explanatory view showing a method of manufacturing the organic EL panel and the operation of the organic EL panel, in accordance with the present embodiment. As shown, since the false patterns 20R, 20G, and 20B are formed outside the display area E, they do not affect the display of the organic EL panel. Furthermore, since the false patterns 20R, 20G, and 20B are disposed in positions separated from the film stripes 30R, 30G, and 30B forming the luminescent areas 40R, 40G, and 40B, these false patterns can act as protective barriers for preventing the adhesive agent 6 from getting into contact with areas near the outermost film stripes 30R, 30G, and 30B.

On the other hand, the adhesive agent 6 generates moisture, oxygen gas or the like which are considered as factors deteriorating the organic luminescent layer. However, since moisture, oxygen gas or the like will erode through some transfer mediums in contact with each other, such an erosion can be prevented if the transfer mediums are not in contact with each other. Namely, if the false patterns 20R, 20G, and 20B serving as protection barriers for preventing the adhesive agent 6 from moving towards the display area are located separately from areas near the outermost film stripes 30R, 30G, and 30B, and if the false patterns 20R, 20G, and 20B are made independent from one another, it is possible to prevent the areas near the outermost film stripes 30R, 30G, and 30B from getting eroded by the adhesive agent.

In order to obtain the above-mentioned effect, it is necessary for the false patterns 20R, 20G, and 20B to be sized such that they are not in direct connection with the areas near the outermost film stripes 30R, 30G, and 30B. On the other hand, the false patterns 20R, 20G, and 20B should not be separated too far away from the display area E, since such an arrangement can reduce a desired utilization efficiency (display area/panel area) of display panel. For this reason, it is required that the false patterns be formed in positions separated from the outermost film stripes 30R, 30G, and 30B at the same pitch as the film stripes. Further, where such separation has been set smaller than the pitch of the film stripes, it is preferable that the width Wd of false openings be made small. If the width W1 of the film stripes 30R, 30G, and 30B is larger than P/3, the edge portions of the film stripes 30R, 30G, and 30B will be overlapped with each other. Accordingly, to independently arrange the false patterns 20R, 20G, 20B with an interval S, it is necessary for the Wd1 of the false patterns 20R, 20G, and 20B to be smaller than the width W1 of the film stripes 30R, 30G, and 30B.

Therefore, as mentioned above, the width Wd of the false openings 10D of the film formation mask 10 is set to be smaller than the width W of the openings 10A. On the other hand, although the width Wd1 of the false patterns 20R, 20G, and 20B is determined by the width Wd of the false openings 10D, the width Wd1 of the false patterns will not be exactly equal to the width Wd of the false openings 10D. This is because there may be some film formation errors due to some error factors (such as pattern deformation due to spread of vapor deposition flow, an operation deviation with the film formation mask, an error of precision in forming mask openings). In view of this, the Wd width of the false openings 10D should be set such that the false patterns 20R, 20G, and 20B will not be overlapped with each other (to ensure the formation of the interval S).

The above-described embodiment shows that in the process of manufacturing an organic EL panel, the film formation mask 10 is caused to slide only a distance P/n (P: pitch of openings 10A; n: the number of different colors for painting) so as to form n lengths of false patterns. However, such an embodiment should not form any limitation to the present invention. For example, FIG. 8 is an explanatory view showing a film formation mask formed according to another embodiment of the present invention.

In this embodiment, as shown in FIGS. 8A to 8C, a plurality of paintings with different colors are performed by different film formation masks 11(R), 11(G), and 11(B). In each of the film formation masks 11(R), 11(G), and 11(B), a plurality of openings 11A corresponding to the film stripes which form luminescent areas in various film formation processes are formed with the same pitch P as the above-described embodiment. Then, outside the outermost openings 11A on the film formation masks 11(R), 11(G), and 11(B), there are formed false openings 11D separated P1, P2, and P3 (P2=P1+P/3, P3=P2+P/3) from the outermost openings 11A of the film formation masks 11(R), 11(G), and 11(B).

Figure 9:
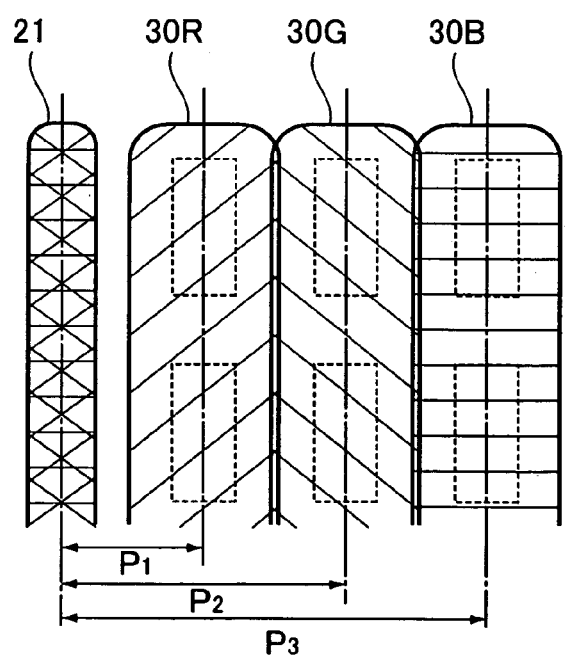
FIG. 9 is an explanatory view showing an organic EL panel treated by painting luminescent areas with different colors using a film formation mask formed according to another embodiment of the present invention.

FIG. 9 is an explanatory view showing an organic EL panel painted by different colors in different luminescent areas using film formation masks 11(R), 11(G), and 11(B). Actually, in the process of forming the film stripes 30R, 30G, and 30B, patterns based on the false openings 11D are laminated in positions separated P1, P2, and P3 from the film stripes 30R, 30G, and 30B, so that it is possible to form one false pattern 21 in each area. In this way, since it is possible to increase the height of each laminated false pattern 21, it is allowed to increase an effect of blocking an adhesive agent. Further, since the false pattern 21 is required to be formed in only one position, it is allowed to increase the space efficiency of the panel.

Figure 8:
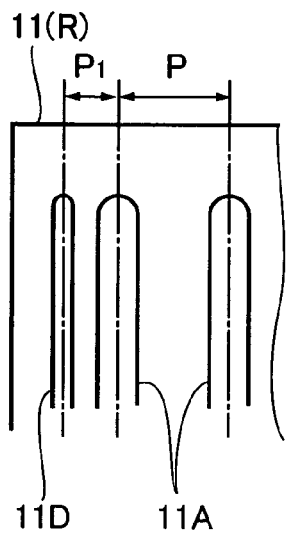
FIGS. 8A-8C are explanatory views showing several film formation masks formed according to another embodiment of the present invention.
Figure 8:
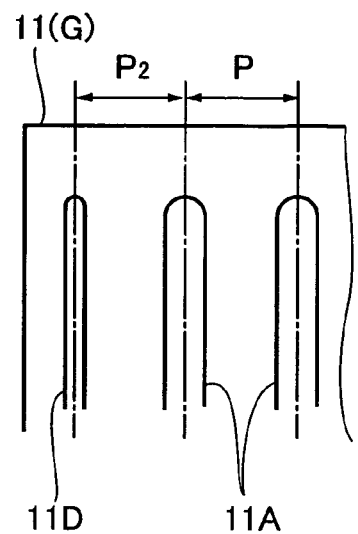
Figure 8:
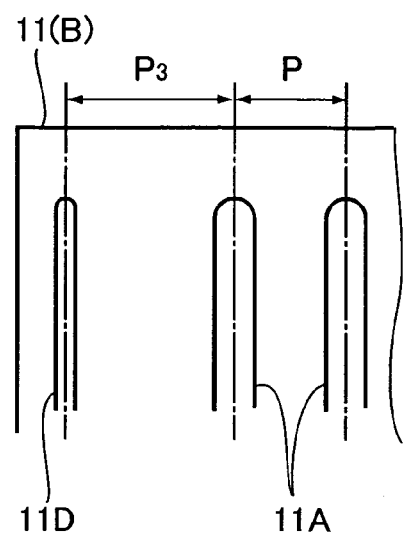

In the embodiment shown in FIG. 8, the film formation masks 11(R), 11(G), and 11(B) can also be constructed such that the false openings 11D are formed on both sides of each mask, or that only one false opening is formed on only one side of each mask. Moreover, it is not absolutely necessary for each of the three film formation masks 11(R), 11(G), and 11(B) to be formed with false opening(s) 11D. In fact, it is allowable to select only one or two of the masks to have such false opening(s) 11D. Alternatively, among the film formation masks 11(R), 11(G), and 11(B), one of them is formed on one side thereof with a false opening 11D, while another is formed on the other side thereof with a false opening 11D.

Figure 10:
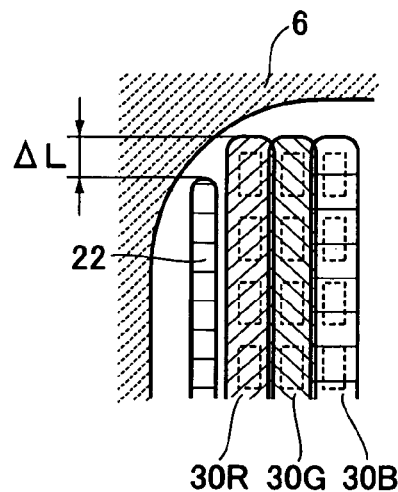
FIGS. 10A-10C are explanatory views showing several different false patterns formed by different film formation masks according to another embodiment of the present invention.
Figure 10:
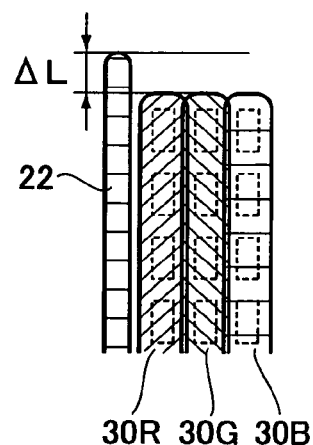
Figure 10:
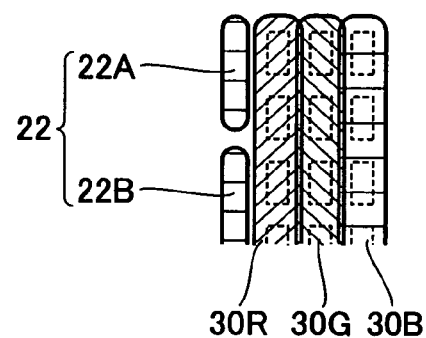

FIGS. 10A-10C are explanatory views showing an example of a false pattern 22 formed in one position. By shaping the false opening 11D into an appropriate form, it is allowed to form a false pattern 22 corresponding in shape to the false opening 11D. FIG. 10A shows that in an area near an edge of the substrate, the length of the false pattern 22 is ΔL shorter than the film stripe 30R (30G, 30B). FIG. 10B shows that in an area near an edge of the substrate, the length of the false pattern 22 is ΔL longer than the film stripe 30R (30G, 30B) to ensure an improved effect of blocking an adhesive agent. FIG. 10C shows that the false pattern 22 (22A, 22B . . . ) can be divided into several portions so as to form false patterns (of expensive organic material) only in necessary areas.

Figure 11:
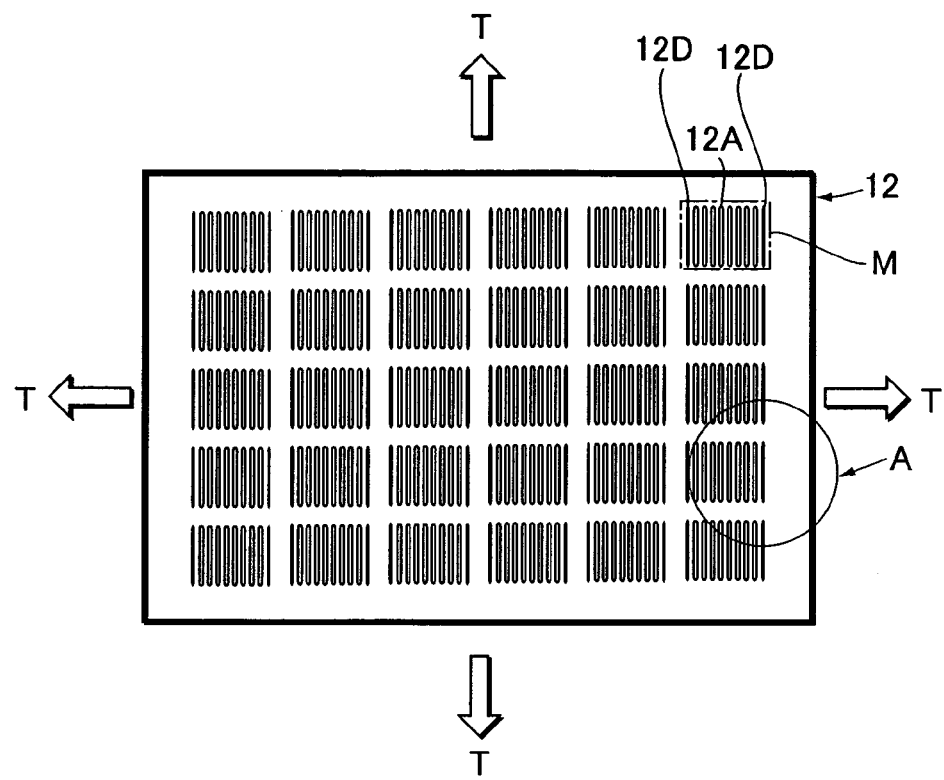
FIGS. 11A and 11B are explanatory views showing a film formation mask according to another embodiment of the present invention.
Figure 11:
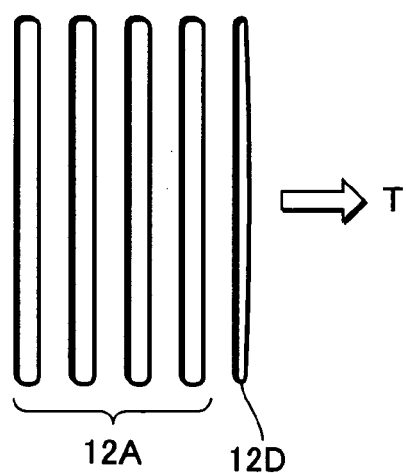
Figure 12:
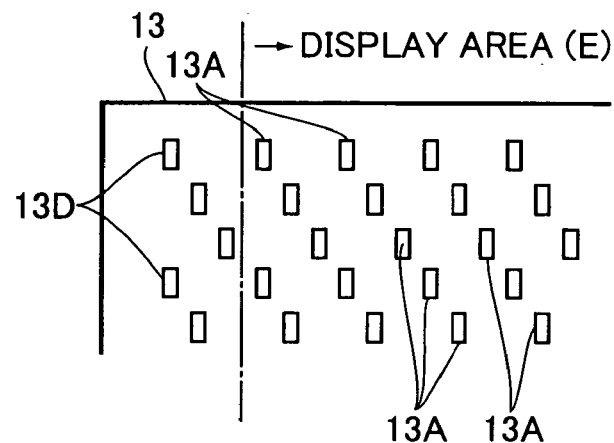
FIGS. 12A-12C are explanatory views showing several different film formation masks formed according to another embodiment of the present invention.
Figure 12:
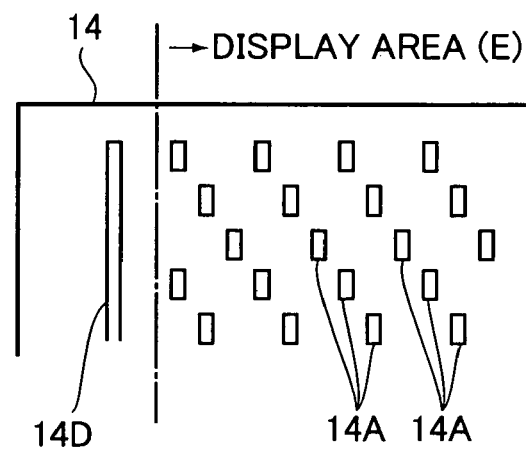
Figure 12:
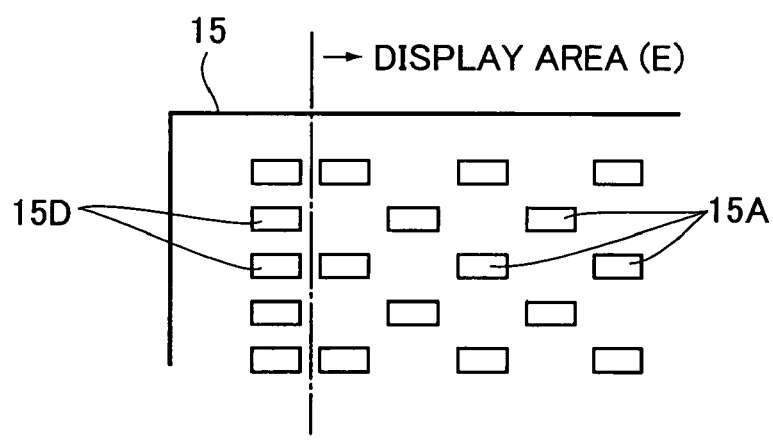

Other embodiments of the film formation mask will be described below with reference to FIGS. 11-13. FIG. 11A is a plan view and FIG. 11B is an enlarged view showing in detail a portion (portion A) of FIG. 11A. An embodiment shown in FIGS. 11A and 11B is a film formation mask for use in forming a plurality of panels on a large-sized substrate. As shown in FIG. 11A, a large-scaled film formation mask 12 includes a plurality of mask units M each corresponding to one piece of panel. Each mask unit M includes a plurality of openings 12A and the false openings 12D arranged in the same manner as that shown in FIG. 2. Further, as shown in FIG. 11A, the plurality of mask units M are arranged in both longitudinal and lateral directions. Specifically, it is important to prevent a slacking when the large-sized film formation mask 12 is being set in position during a manufacturing process, so that a relatively large tension T is added. At this time, as shown in FIG. 11B, since a possible deformation caused by the tension T can be absorbed by the false openings 12D located near the outer edges of each mask unit M, there would be no deformation in the openings 12A for forming luminescent areas. In this way, with regard to each panel, it is possible to form film stripes with high precision in an entire display area, thereby obtaining panels with high display performance.

Although the film formation masks 10, 11, and 12 in the above-described embodiments have stripe-like openings 10A, 11A, and 12A, the openings of film formation masks of the present invention should not be limited to stripe-like shape. For example, FIGS. 12A-12C show film formation masks formed according to further embodiments of the present invention. FIG. 12A shows a film formation mask 13 having vertically (in the drawing) arranged rectangular openings 13A disposed alternately corresponding to the display area E, while false openings 13D having the same shape as the openings 13A are formed as extensions of the arrangement of the openings 13A on the outside of the display area E. FIG. 12B shows a film formation mask 14 having vertically (in the drawing) arranged rectangular openings 14A disposed alternately corresponding to the display area E, while only a single one false opening 14D having an elongated shape is formed on the outside of the display area E. FIG. 12C shows a film formation mask 15 having horizontally (in the drawing) arranged rectangular openings 15A disposed alternately corresponding to the display area E, while false openings 15D having the same shape as the openings 15A are formed corresponding to all horizontal rows of the openings 15A on the outside of the display area E, thereby forming a column of the false openings 15D.

Actually, the shape of the false openings should not be specifically limited, but can be in any one of other forms, provided that it is possible to ensure an effect of absorbing a distortion during an addition of a tension, as well as to form false patterns outside the display area for acting as adhesive blocking barriers.

Although the above embodiments have been described on the assumption that different colors are painted on the formed films divided in accordance with respective luminescent colors, the present invention should not be limited by these embodiments. In particular, as a method of forming color display panel, it is allowed to employ not only the method of painting different colors (two or more colors) on a luminescent layer by sliding or changing a film formation mask, but also CF Method or CCM Method which combines a color conversion layer (based on a color filter or fluorescent material) with a luminescent layer of a single color such as white or blue, as well as Photobleaching Method which applies an electromagnetic wave or the like to the luminescent areas of monochromatic luminescent layer so as to realize a plurality of luminescent layers. Further, as color display panel formation method not involving painting different colors, it is allowed to carry out a process which does not involve repeatedly using the film formation mask.

Figure 13:
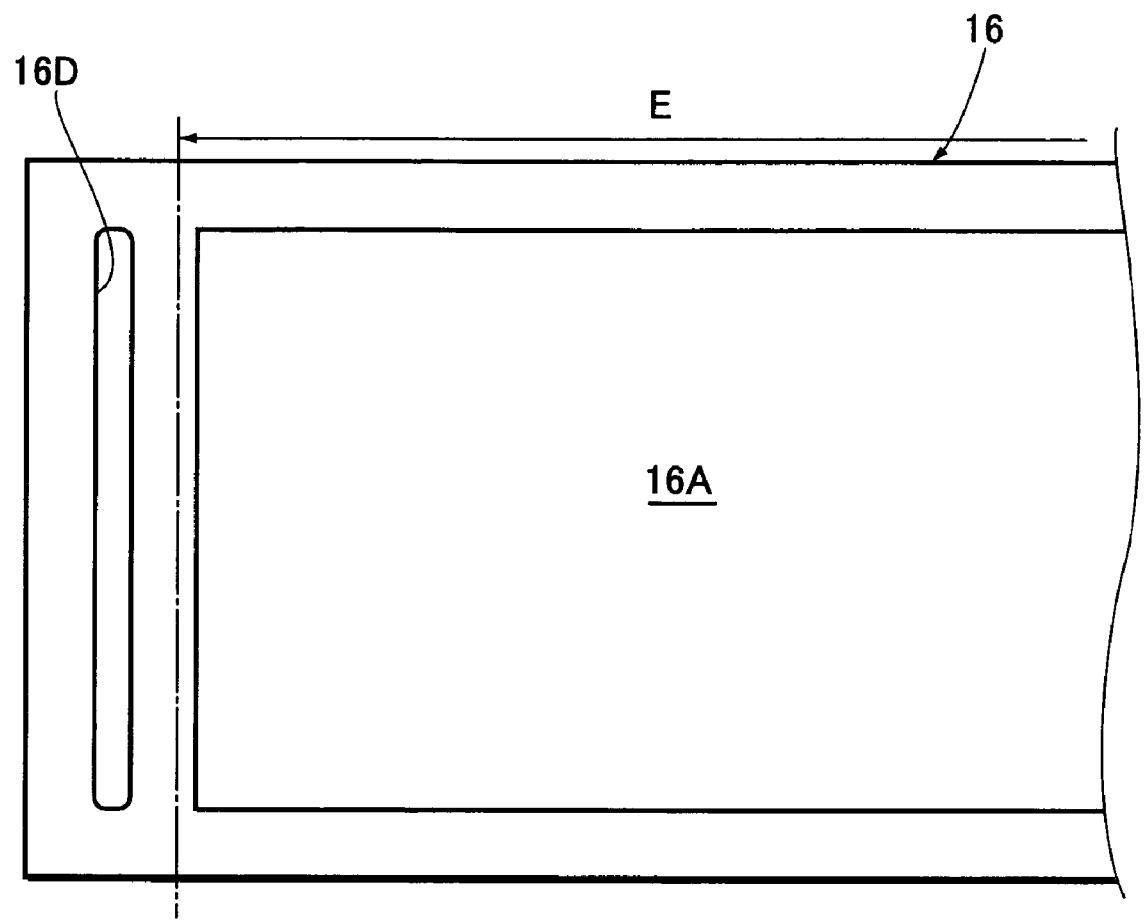
FIG. 13 is an explanatory view showing a film formation mask formed according to another embodiment of the present invention.

For example, it is possible to use a film formation mask 16 shown in FIG. 13. As shown, the film formation mask 16 has an opening 16A corresponding to the display area E, as well as a false opening 16D formed outside the outermost edge of the opening 16A and not involved in forming organic layer in luminescent area. In this way, when a film pattern of an organic layer is formed all over the display area E, it is possible to form a false pattern of an organic layer on the outside of the display area E. Therefore, no matter which of the aforementioned CF Method, CCM Method and Photobleaching Method is employed, it is possible to form the false pattern functioning as a protection barrier (for blocking an adhesive agent) on the outside of the display area.

Moreover, film formation mask, organic EL panel, and organic EL panel manufacturing method should not be limited by the structure of organic EL devices, and in fact it is possible to laminate a plurality of organic luminescent layers (each interposed between a pair of electrodes) on the substrate so as to form a multi-color luminescent structure. For example, it is possible to laminate (on the substrate) lower electrodes, a first organic luminescent layer, first intermediate electrodes, a second organic luminescent layer, second intermediate electrodes, a third organic luminescent layer, and upper electrodes.

The features and advantages of film formation mask, organic EL panel, and organic EL panel manufacturing method according to the preferred embodiments of the present invention may be concluded as follows.

Firstly, the film formation mask of the present invention has openings arranged corresponding to a film pattern for forming luminescent areas of the organic EL devices, and has false openings located outside an area containing the openings. Therefore, a tension added when setting the film formation mask can be absorbed by the false openings, thereby preventing an undesired deformation of the openings formed corresponding to luminescent areas. As a result, there would be no film pattern disorder near the outermost edge of the display area.

Secondly, film pattern of an organic layer for forming luminescent areas of organic EL devices are formed on the substrate by virtue of the openings of the film formation mask, while the false patterns of the organic layer are formed outside an area containing luminescent areas, by virtue of the false openings. In this way, the false patterns can serve as protection barrier for blocking an adhesive agent applied around the display area, thereby preventing the outmost edge of the display area from contacting the adhesive agent, thus preventing an erosion of the adhesive into the display area.

Thirdly, using the method of manufacturing an organic EL panel, the false patterns serving as protection barrier for blocking an adhesive agent and the film pattern for forming luminescent areas can be formed simultaneously. Therefore, it is possible to realize an efficient formation of the false patterns without having to change the existing manufacturing process.

Fourthly, with regard to the above-described film formation mask, the organic EL panel, and the method of manufacturing the organic EL panel, since the width of each false opening is set to be narrower than the width of each opening, and since the width of each false pattern is set to be narrower than the width of each film stripe for forming luminescent areas, even if the film formation mask is slid a distance equal to the width of an opening in order to paint different colors on the film pattern, it is still possible for the false patterns to be formed completely separated from film pattern. In this way, by virtue of the separately formed false patterns, it is possible to protect the luminescent areas by completely blocking some deterioration factors (harmful to the organic layer) transported inwardly through the contact with the adhesive agent, thereby exactly enabling the false patterns to act as barriers for blocking the adhesive agent.

Fifthly, since film formation error in forming patterns is taken into account when setting the width of the false openings and the width of the false patterns, it is possible to exactly separate the false patterns (even if film formation errors have occurred due to various error factors) from film pattern. Consequently, by virtue of the separately formed false patterns, it is possible to protect the luminescent areas by completely blocking some deterioration factors (harmful to the organic layer) transported inwardly through the contact with the adhesive agent, thereby exactly enabling the false patterns to act as barriers for blocking the adhesive agent.

Sixthly, with the above-described film formation mask, organic EL panel and organic EL panel manufacturing method, since the length of the false openings is shorter than the length of the above openings in the corner portions of the substrate, and since the length of the false openings is shorter than the length of a film pattern, there would be no overlap between an adhesive area and a false pattern (even if an adhesive area has been made quite large in a corner of the substrate), thereby ensuring an exact bonding of a cover and enabling the false patterns to function as protective barriers.

Seventhly, with the above-described film formation mask, organic EL panel and organic EL panel manufacturing method, since the openings of the film formation mask are used to paint at least two luminescent colors on the organic luminescent layer, and since the film pattern is formed by painting different colors, it is possible to form a plurality of false patterns by virtue of the false openings, corresponding to the number of times of painting different colors. In this way, a plurality of false patterns may be formed simultaneously in the process of painting different colors in luminescent areas. Moreover, it is possible for a plurality of false patterns to exactly protect the organic layer from several factors (harmful to the organic layer) transported from the adhesive agent.

EXAMPLE

An example of the present invention will be described in the following. However, the present invention should not be limited by such specific example.

[Film Formation Mask]

The film formation mask is formed by processing a metal film containing nickel or the like, by virtue of chemical etching, mechanical polishing, or sandblasting. On the other hand, it is also possible to employ an electro-casting method which is excellent informing a fine pattern with a high precision and adapted to form thick mask portion in a film formation mask.

When electro-casting method is used, at first, a patterning resist is formed by photolithography process on a metal electro-casting matrix. In detail, the patterning resist is formed corresponding to the opening pattern and false opening pattern of the film formation mask. Then, after depositing a film formation mask material on the electro-casting matrix in an electrolytic solution and thus forming mask portion, the mask portion having formed thereon a desired opening pattern and a desired false opening pattern can be produced by removing the patterning resist. At this time, an appropriately completed film formation mask can be obtained by removing the mask portion from the electro-casting matrix.

The sizes of various parts of the film formation mask are as shown in FIG. 2 (where three different colors are painted) Namely, if the width W of the openings is W=50 µm, the pitch P of the openings will be P≦3×50 µm. Moreover, since there are some error factors including deformation amount e1 (an arrival error of vapor deposition flow) due to an interval between the film formation mask and the substrate, an operation deviation amount e2 occurred when setting the film formation mask on the substrate, and an error amount e3 in mask pattern formation precision, the width Wd of the false openings should be set to be narrower than the width W of the openings. That is, the width Wd of each false opening is set by Wd=W−(e1+e2+e3), so that when W=50 µm and when e1=e2=e3=5 µm, the width Wd of each false opening will be Wd=35 µm.

[Organic EL panel]

Various portions of an organic EL panel are shown in the following Table 1.

TABLE 1

| Components | Suitable Materials | Functions |
| --- | --- | --- |
| Substrate | Glass | Display Substrate (Bottom Emission) |
| Lower Electrodes | ITO, IZO, $In_2O_3$ | Anodes (Transparent Electrodes) |
| Insulating Layer | Polyimide | |
| Hole Injection Layer | CuPc | Organic Layer |
| Hole Transporting Layer | NBP, PPD, m-MTDATA | Organic Layer |
| Luminescent Layers (R) (G) (B) | $Alq_3$ + DCM $Alq_3$ + Coumarin IDE120 + IDE102 BAlq + Perylene | Organic Luminescent Layer |
| Electron Transporting Layer | $Alq_3$, OXD-1 | Organic Layer |
| Electron Injection Layer | $LiO_2$, LiF | Organic Layer |
| Upper Electrodes | Al, Mg, Mg—Ag | Cathodes |
| Adhesive Agent | UV-Curable Resin | |
| Cover | Glass, Metal Cap | |

[Manufacturing Method]

An electrode material for forming anodes is deposited as a thin film on a substrate by virtue of vapor deposition, sputtering or the like, followed by patterning the deposited film into a desired electrode structure by photolithography process or the like. Further, an insulating material is applied and luminescent area formation portions are patterned by photolithography process or the like. Subsequently, hole injection layer material and hole transporting layer material are vapor deposited successively.

Next, film formation mask is used to deposit luminescent-layer material in accordance with RGB luminescent areas, thereby forming a desired film pattern in the display area of a display panel. Meanwhile, false patterns consisting of luminescent-layer material are formed outside the display area. Afterwards, electron transporting-layer material and electron-injection layer material are vapor-deposited successively on the formed film pattern in the display area, followed by vapor-depositing an electrode material for forming upper electrodes.

Then, an adhesive agent is applied to the outermost edge of the formed display area and to the outside of false patterns. Subsequently, the adhesion surface of a cover is pressed to the adhesive-applied area, so as to tightly bond the cover (covering the display area and the false patterns) to the substrate.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An organic EL panel including a substrate and organic EL devices formed on the substrate, each organic EL device including a pair of electrodes and an organic layer containing an organic luminescent layer, said organic layer being interposed between the pair of electrodes,
    wherein formed on the substrate are a film pattern of the organic layer for forming luminescent areas of the organic EL devices, and false patterns of the organic layer located outside an area containing the luminescent areas,
    wherein the width of each false pattern is smaller than the width of each film stripe.

2. The organic EL panel according to claim 1, wherein the false patterns are formed by virtue of the false openings of a film formation mask which has openings for forming the film pattern, said false openings being located outside an area containing said openings.

3. The organic EL panel according to claim 1, wherein the length of each false pattern is shorter than the length of each film stripe in the corner portions of the substrate.

4. The organic EL panel according to claim 1, wherein said film pattern is formed by painting two or more different luminescent colors on the organic luminescent layer.

5. An organic EL panel including a substrate and organic EL devices formed on the substrate, each organic EL device including a pair of electrodes and an organic layer containing an organic luminescent layer, said organic layer being interposed between the pair of electrodes,
    wherein formed on the substrate are a film pattern of the organic layer for forming luminescent areas of the organic EL devices, and false patterns of the organic layer located outside an area containing the luminescent areas,
    wherein the length of each false pattern is shorter than the length of each film stripe in the corner portions of the substrate.

6. The organic EL panel according to claim 5, wherein the false patterns are formed by virtue of the false openings of a film formation mask which has openings for forming the film pattern, said false openings being located outside an area containing said openings.

7. The organic EL panel according to claim 5, wherein the width of each false pattern is smaller than the width of each film stripe.

8. The organic EL panel according to claim 5, wherein said film pattern is formed by painting two or more different luminescent colors on the organic luminescent layer.

* * * * *